US009276402B2

(12) United States Patent
Niemela

(10) Patent No.: US 9,276,402 B2
(45) Date of Patent: Mar. 1, 2016

(54) PHOTOVOLTAIC SYSTEM POWER OPTIMIZATION

(71) Applicant: Fairchild Semiconductor Corporation, San Jose, CA (US)

(72) Inventor: Van Niemela, Richardson, TX (US)

(73) Assignee: Fairchild Semiconductor Corporation, San Jose, CA (US)

(*) Notice: Subject to any disclaimer, the term of this patent is extended or adjusted under 35 U.S.C. 154(b) by 656 days.

(21) Appl. No.: 13/671,278

(22) Filed: Nov. 7, 2012

(65) Prior Publication Data

US 2013/0307342 A1 Nov. 21, 2013

Related U.S. Application Data

(60) Provisional application No. 61/556,613, filed on Nov. 7, 2011.

(51) Int. Cl.
*H02J 1/00* (2006.01)
*H02J 3/38* (2006.01)
*H01L 31/02* (2006.01)
*H02J 1/08* (2006.01)
*H02J 1/10* (2006.01)

(52) U.S. Cl.
CPC ............ *H02J 1/00* (2013.01); *H01L 31/02021* (2013.01); *H02J 3/383* (2013.01); *H02J 1/08* (2013.01); *H02J 1/102* (2013.01); *H02J 3/385* (2013.01); *Y02E 10/563* (2013.01); *Y02E 10/58* (2013.01); *Y10T 307/50* (2015.04); *Y10T 307/707* (2015.04)

(58) Field of Classification Search
CPC ............... H02J 1/00; H02J 3/383; H02J 1/08; H02J 1/102; H02J 3/385; H01L 31/02021
See application file for complete search history.

(56) References Cited

U.S. PATENT DOCUMENTS

| 7,564,149 | B2 * | 7/2009 | Siri et al. ................ 307/80 |
| 8,754,627 | B1 * | 6/2014 | Le .......................... 323/299 |
| 2006/0222916 | A1 * | 10/2006 | Norimatsu et al. ........ 429/23 |
| 2008/0150366 | A1 * | 6/2008 | Adest et al. ............... 307/77 |
| 2011/0316346 | A1 * | 12/2011 | Porter et al. .............. 307/82 |

FOREIGN PATENT DOCUMENTS

WO    WO96/18937    * 12/1994    ............. G05F 1/30

* cited by examiner

*Primary Examiner* — Zeev V Kitov
(74) *Attorney, Agent, or Firm* — Grossman Tucker Perreault & Pfleger PLLC

(57) ABSTRACT

An example system may comprise at least one solar panel including a plurality of photovoltaic cells, wherein the photovoltaic cells are grouped into at least a first group of cells and a second group of cells. The first and second groups of cells may be coupled in series to a DC bus to deliver DC voltage and power to the DC bus. The system may further include first power conversion circuitry configured to generate power from the first group of cells and second power conversion circuitry configured to generate power from the second group of cells, and inverter circuitry coupled to the DC bus and configured to generate AC power from the DC bus. The first power conversion circuitry may be configured to automatically adjust at least one of an output voltage or power delivered to the DC bus based on an operating point of the second power conversion circuitry.

8 Claims, 6 Drawing Sheets

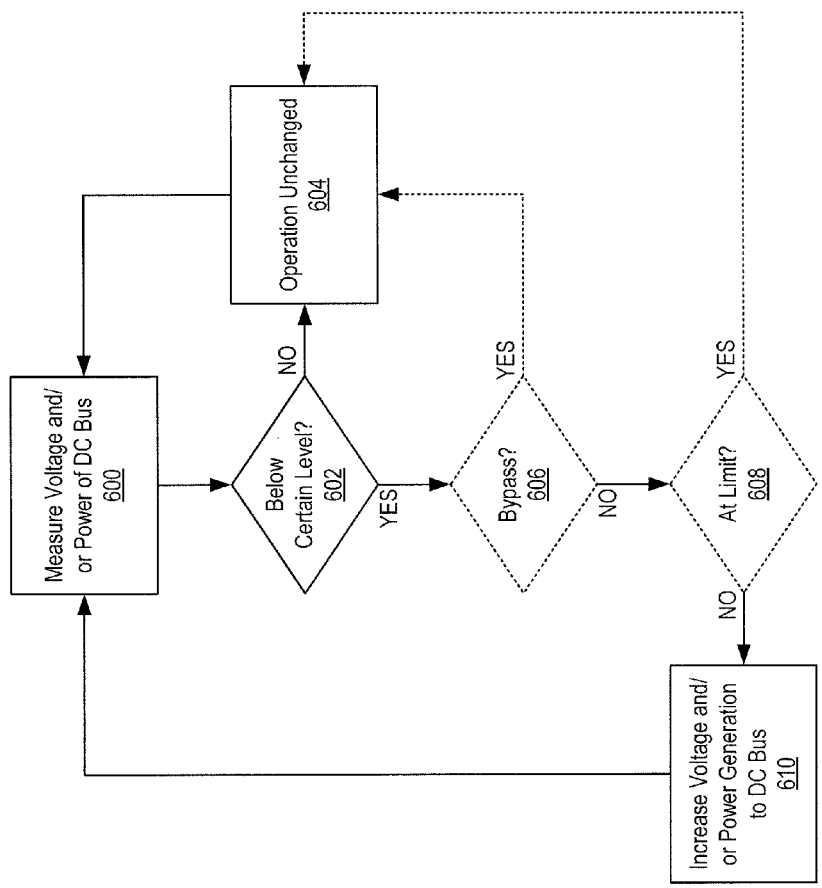

PHOTOVOLTAIC SYSTEM POWER OPTIMIZATION

PRIORITY

The present U.S. Patent Application claims priority to U.S. Provisional Patent Application No. 61/556,613 entitled "PHOTOVOLTAIC SYSTEM POWER OPTIMIZATION" filed on Nov. 7, 2011, the contents of the above parent application being incorporated herein, in entirety, by reference.

FIELD

The present disclosure relates to improved power optimization for photovoltaic systems.

BRIEF DESCRIPTION OF DRAWINGS

Features and advantages of the claimed subject matter will be apparent from the following detailed description of embodiments consistent therewith, which description should be considered with reference to the accompanying drawings, wherein:

FIG. 6 illustrates example operations for controlling power generation in power conversion circuitry consistent with the present disclosure.

Although the following Detailed Description will proceed with reference being made to illustrative embodiments, many alternatives, modifications, and variations thereof will be apparent to those skilled in the art.

DETAILED DESCRIPTION

Generally, this disclosure describes power techniques for photovoltaic systems. In one example, solar cells on a solar panel are divided into multiple strings, and the power of each string is independently controlled to extract, for example, a maximum power out of each string.

Figure 1:
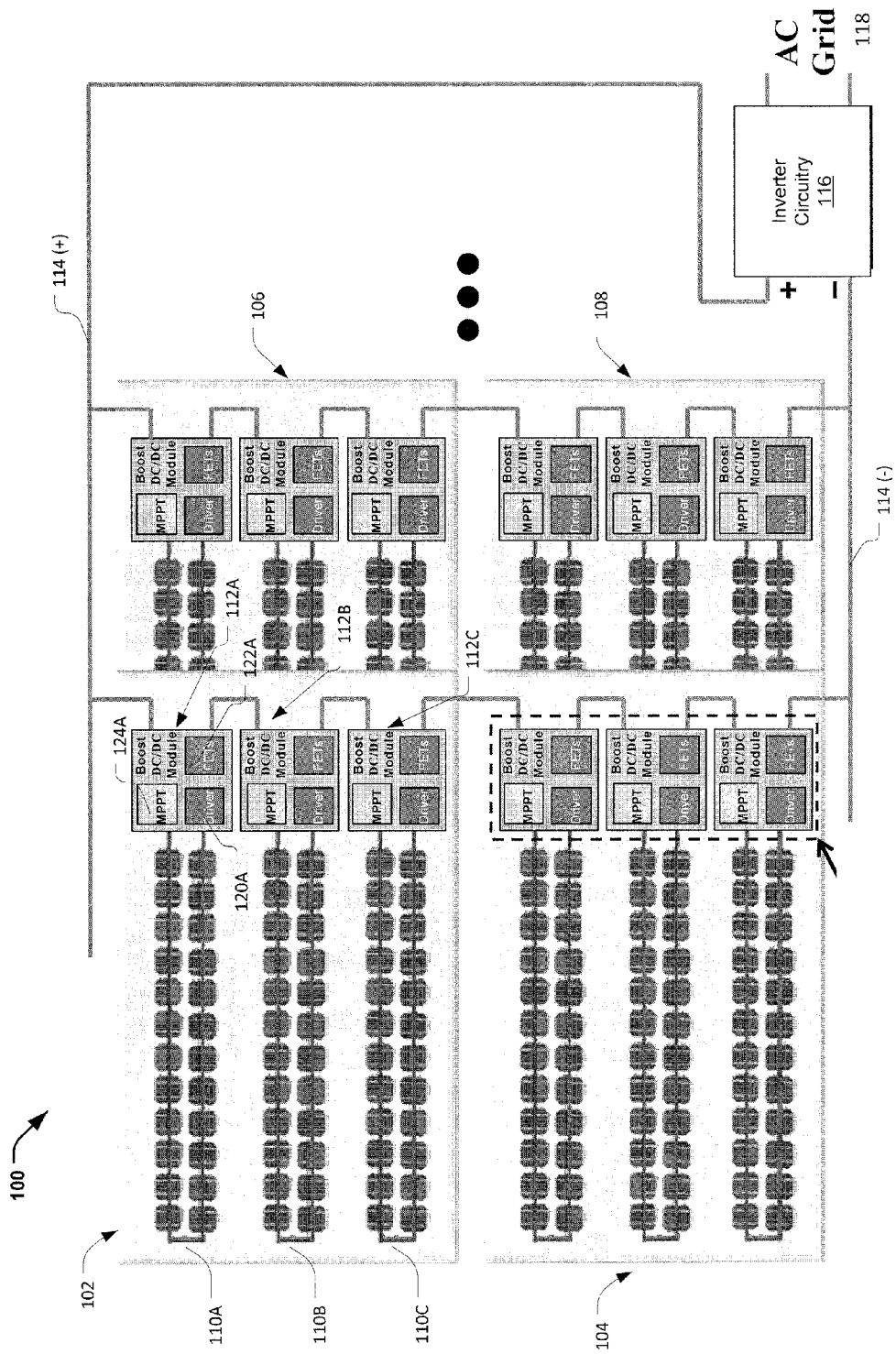
FIG. 1 illustrates a photovoltaic system consistent with various embodiments of the present disclosure.

FIG. 1 illustrates a photovoltaic system 100 consistent with various embodiments of the present disclosure. The photovoltaic system 100 depicted in FIG. 1 includes a plurality of solar panels, e.g., panels 102, 104, 106, 108 .... Taking panel 102 as an example, the photovoltaic cells of the panel 102 may be grouped in strings, e.g., string 110A, string 110B, string 110C. Each string may include power conversion circuitry, for example, power conversion circuitry 112A, power conversion circuitry 112B and power conversion circuitry 112C, respectively. Each string may be coupled together in series to deliver power to a DC Bus 114. In some embodiments, multiple panels may be connected together in a parallel and/or series arrangement to deliver power to the DC bus 114. For example, as shown in FIG. 1, panels 102/104 and 106/108 may be coupled together in series, and the group of panels 102/104 may be coupled in parallel to the group of panels 106/108. Of course, this is only an example of series/parallel coupling that may be utilized by the present disclosure, and in other embodiments the number of panels that are connected in series and/or parallel may be based on, for example, a desired voltage level on the DC bus 114.

Inverter circuitry 116 may be included to convert the DC voltage present on the DC bus 114 to an AC voltage 118. In some embodiments, the inverter circuitry 116 may be configured to convert the voltage on the DC bus 114 to a conventional AC line level, e.g., 120 VAC or 240 VAC. Inverter circuitry 114 may include a well-known inverter topology, for example, push-pull, half bridge, full bridge, etc., and/or an after-developed inverter topology that is configured to convert a DC source into an AC power line. Advantageously, in some embodiments, the inverter circuitry 114 may be simplified to include only a DC-AC inversion stage circuitry (e.g., feedback controller circuitry, switch network circuitry and transformer/output stage circuitry, not shown) that is configured to regulate the input voltage of the inversion stage to a fixed and/or pre-determined value. In addition, in some embodiments, the inverter circuitry 114 may be configured to operate without the need for communication with the power conversion circuitry (e.g., circuitry 112A), thus further simplifying design considerations.

Taking power conversion circuitry 112A as an example, circuitry 112A may be generally configured as a boost DC-DC converter that includes driver circuitry 120A, switch circuitry 122A and control circuitry 124A. The driver circuitry 120A and switch circuitry 122A are each configured to generate a DC voltage/current from the voltage/current present in photovoltaic cells of the corresponding string 110A. In at least one embodiment, control circuitry 124A may be configured to control the driver circuitry 120A and/or switch circuitry 122A to extract a maximum available power (represented as V*I) from the string 110A. To that end, control circuitry 124A may be configured to implement a maximum power point tracking (MPPT) method, or similar method as is known in the art, to control the driver circuitry 120A and/or switch circuitry 122A. It should be understood that the power conversion circuitry of other strings may operate in a similar manner. While FIG. 1 depicts that each string includes power conversion circuitry, in some embodiments, power conversion circuitry may be operable with two or more groups of strings. In addition, other DC-DC converter topologies such as Buck-Boost, SEPIC, Flyback, etc., may be used instead of, or in addition to, the boost topology described herein.

Figure 2:
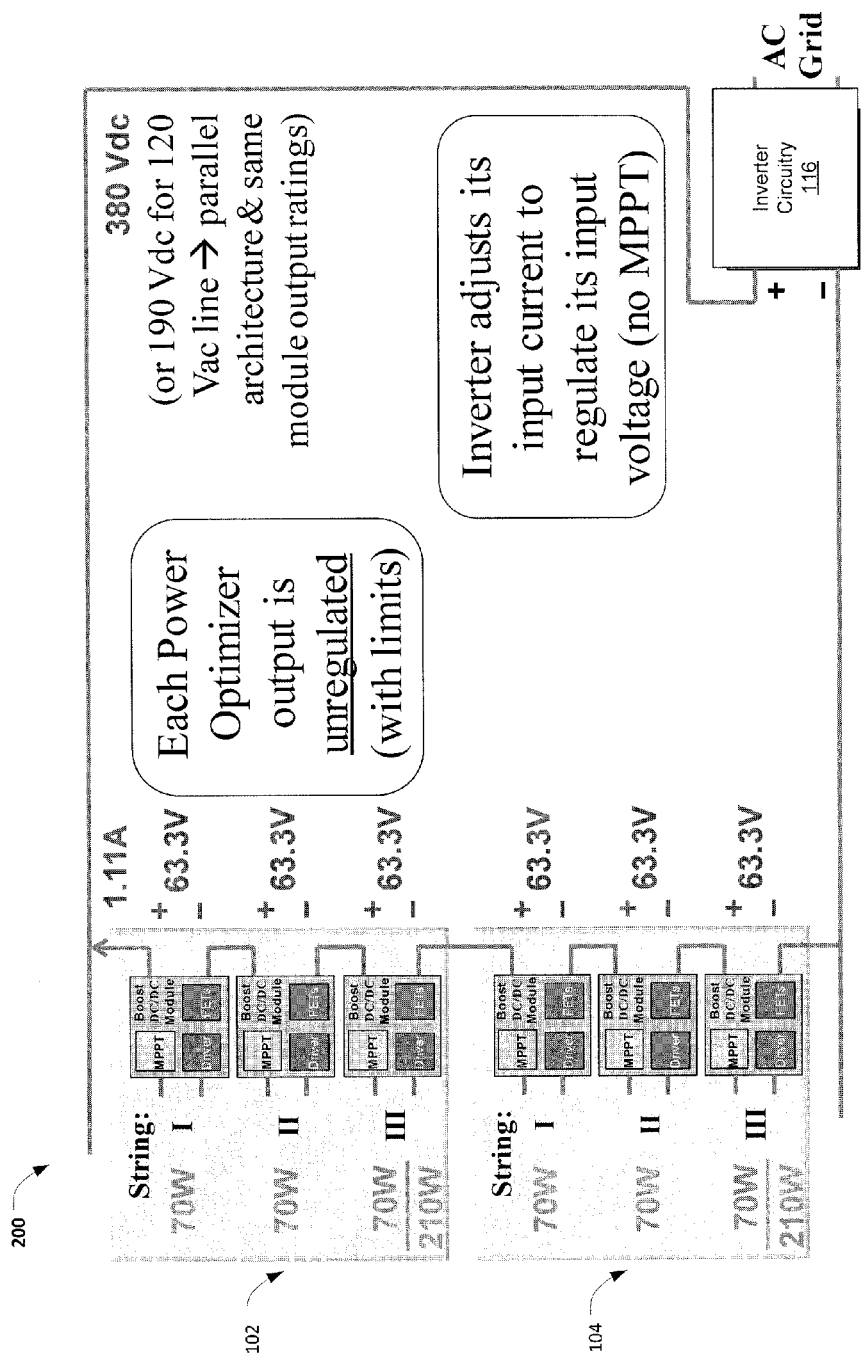
FIG. 2 illustrates a steady-state operating point of a photovoltaic system consistent with one embodiment of the present disclosure.

FIG. 2 illustrates a steady-state operating point of a photovoltaic system 200 consistent with one embodiment of the present disclosure. In this example, two panels (102 and 104) are connected in series, and each panel includes three strings, for a total of six strings connected in series, delivering a nominal DC bus voltage of, in this example 380 VDC. The selection of 380 VDC bus voltage may be based on efficiency considerations for the inverter circuitry to generate a 240 VAC line voltage. Thus, each string may be configured to deliver 63.3 VDC. In this example, the output operating point of each power conversion circuit is uniquely (and independently) determined by the DC bus voltage level and the power delivered by each power conversion circuit. The DC bus voltage may be regulated by the inverter circuitry, and the power output of each power conversion circuitry is determined by the power output of the string, minus the loss through the power conversion circuitry. In this example, the output of each string is 70 W, giving a string current of 420 W/380V=1.11 A, and an output voltage of each power conversion circuit of 70 W/1.11 A=63.3 VDC. In other examples, the panels may be arranged to deliver 190 VDC bus voltage, which may be more efficient to deliver a conventional 120 VAC line voltage.

The inverter circuitry may include feedback controller circuitry that is configured to regulate the AC voltage output and regulate the DC voltage input present on the DC bus. For example, if the inverter circuitry operates to lower the input current, the bus voltage may rise to deliver the same power to the input of the inverter circuitry, as determined by the power output of each string. Conceptually, each power conversion circuit may be seen as including a capacitor across the output whose voltage cannot change instantly. The reduced current into the inverter may initially cause each power conversion circuit to deliver less power to the inverter, while the power generated by the photovoltaic cells is unchanged. The excess power in each string may be utilized to charge the capacitor, thereby increasing the output power until an equilibrium of the DC bus is re-established. Thus, advantageously, the systems described herein are self-balancing without requiring communication between strings or between the strings and the inverter circuitry.

Figure 3:
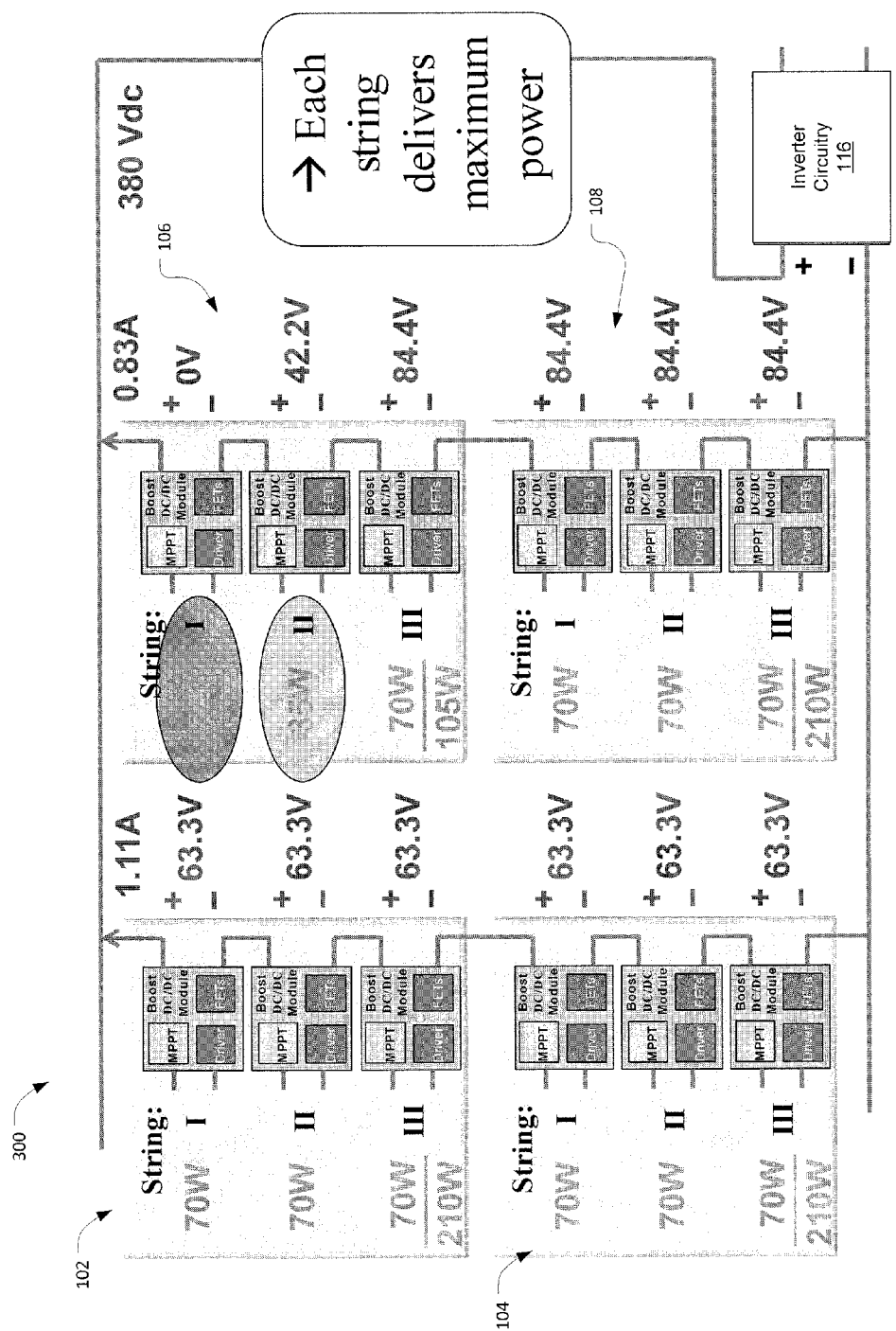
FIG. 3 illustrates changing operating points in response to partial shading of a photovoltaic system consistent with one embodiment of the present disclosure.

FIG. 3 illustrates changing operating points in response to partial shading of a photovoltaic system 300 consistent with one embodiment of the present disclosure. In this example, string I of panel 106 is fully shaded such that this string delivers no power, and string II of panel 106 is partially shaded such that its power is reduced from 70 W. to 35 W. Panels 102 and 104 operate as described above. Since the DC bus voltage is fixed (e.g., 380 VDC in this example), each string may be configured to adjust a supplied power in response to other strings, but without the need for strings to communicate with one another. Since strings I and II of panel 106 are operating at less than nominal value, string III of panel 106 and strings I, II, and III of panel 108 will adjust the output to meet the DC bus voltage requirements. For example, as depicted, string II of panel 106 will deliver its maximum voltage (42.2 VDC) given its partial shading limitations, while string I is incapable of providing any power. To compensate and to provide the required DC bus voltage of 380 VDC, string II and strings I, II and III of panel 108 will adjust the output voltage upward to 84.4 VDC so that the total in the series chain is 380 VDC. Thus, each power conversion circuit is configured to determine its own unique operating point to deliver the correct amount of power to the inverter circuitry.

It should be noted that, to meet load requirements, each power conversion circuit may be configured to operate in a "constant power" mode where the product of the output voltage and current of the power conversion circuitry is approximately equal to the maximum power capable of being produced by the associated string. However, in some designs, it may be desirable and/or required that the output voltage is limited, and thus, in some embodiments, different operating modes may be enabled to prevent a power conversion circuit that is otherwise providing little or no power from limiting the output from the other strings connected in series. For example, the power conversion circuitry may also be configured to operate in a "voltage limit" mode which permits the use of most of the available power in a given string, which may be useful in the case of a partially shaded string to enable it to continue contributing to the overall power produced by the panel. A "bypass" mode may be enabled if a given string can produce only a little or no power relative to other strings.

Figure 5:
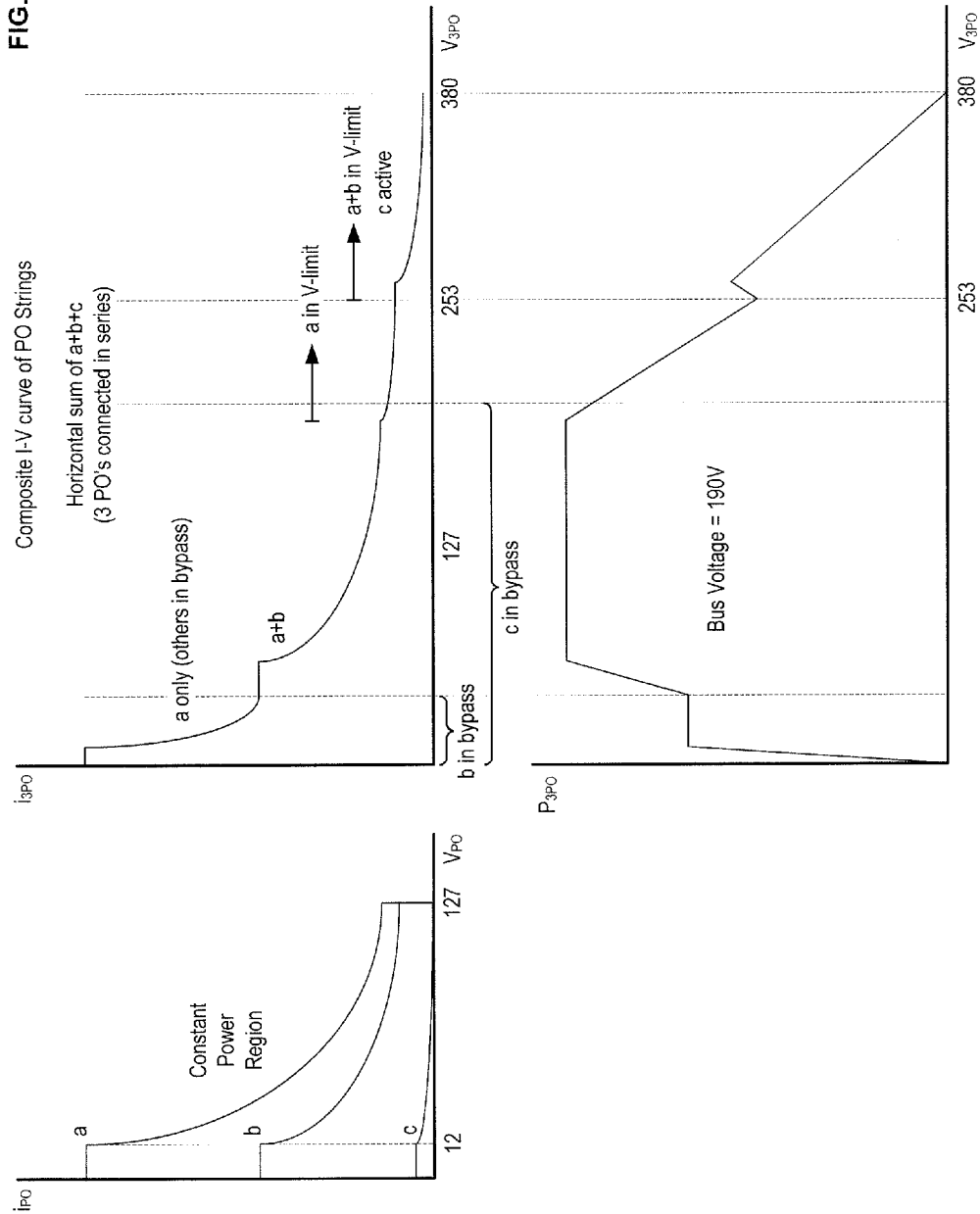
FIG. 5 illustrates composite I-V curves of three series-connected photovoltaic strings according to one embodiment of the present disclosure.

These concepts are depicted in FIG. 5, which illustrates composite I-V curves of three series-connected photovoltaic strings according to one embodiment of the present disclosure. It is important to note that the curves illustrated in FIG. 5 are intended only to be representative of the relative behavior of current, voltage and power in accordance with an example embodiment, and thus, are not drawn to scale. The strings in this example are labeled a, b and c. The upper left curve illustrates the constant power region of the three strings. The upper middle curve depicts the strings in a variety of operating modes including constant power mode, voltage limit mode and bypass mode. The lower middle curve, taken in conjunction with the upper middle curve, depicts the bus voltage delivered by various strings in various operating modes.

Figure 4:
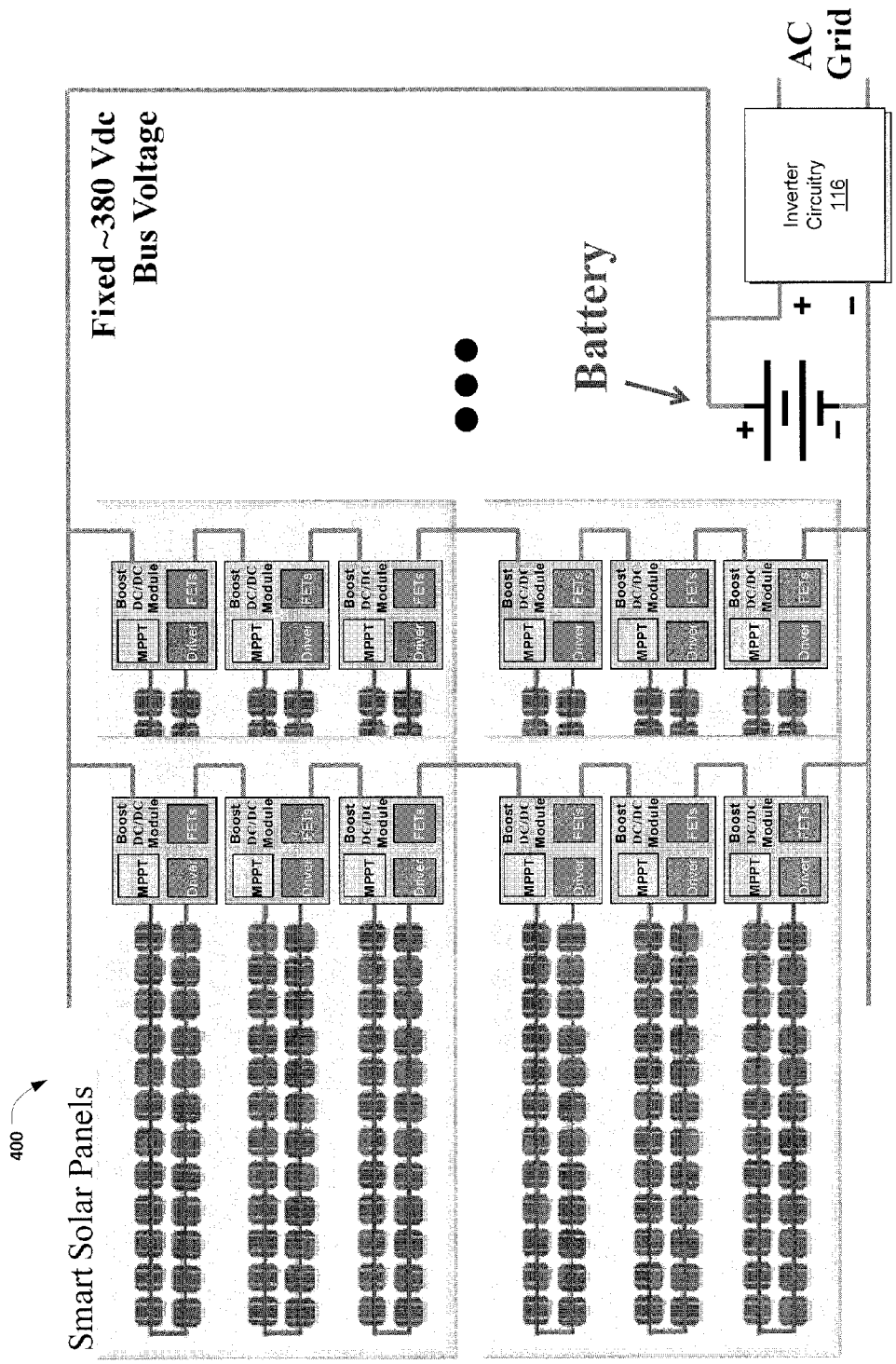
FIG. 4 illustrates a photovoltaic system that includes a battery consistent with another embodiment of the present disclosure.

FIG. 4 illustrates a photovoltaic system 400 that includes a battery consistent with another embodiment of the present disclosure. In this embodiment, a battery may be included to store energy produced by the panels. The battery may be configured to store excess energy and, when needed, supply energy to the AC grid when the power delivered by the solar panels is insufficient (e.g., night, rainy/cloudy days, etc.). The battery may have a voltage that is approximately equal to the DC bus voltage. In such a topology, the inverter circuitry and/or other control circuitry (not shown) may be configured to manage the flow of energy into and out of the battery. In one embodiment, the battery may be coupled directly across the DC bus, and the battery charge may be controlled by the inverter circuitry directly (e.g., without need for additional charge control circuitry). For example, the battery may be charged by raising the bus voltage above the open-circuit battery voltage, or discharged by lowering the bus voltage below the open-circuit battery voltage. If the bus voltage is equal to (or approximately equal to) the battery voltage, the system may operate as described above as if the battery were not present. The rate of energy flowing into or out of the battery may be approximately proportional to the magnitude of the voltage shift away from the open-circuit battery voltage, thus enabling control over battery charging and discharging. Typically, the shifts in bus voltage needed to manage the battery are a small percentage of the bus voltage, and thus, the output voltage and current rating of each power conversion circuit may require only a small adjustment. In some embodiment, the inverter circuitry may include bidirectional converter circuitry (not shown) to enable enhanced control of the battery.

FIG. 6 illustrates example operations for controlling power generation in power conversion circuitry 112 (e.g., 112A) consistent with the present disclosure. In operation 600 voltage and/or power may be measured in the DC bus 114. A determination may then be made in operation 602 as to whether the voltage and/or power are below a certain level (e.g., set by the inverter circuitry 116. If in operation 602 it is determined that the voltage and/or power is not below the certain level, then in operation 604 the operation of power conversion circuitry 112 may continue unchanged. Operation 604 may then be followed by a return to operation 600 to reinitiate control operations for conversion circuitry 112 with another measurement.

If in operation 602 it is determined that the voltage and/or power is below the certain level, then in optional operation 606 a further determination may be made as to whether the power conversion circuitry 112 is in bypass mode. Operations 606 and/or 608 may be optional in that they may only pertain to example embodiments where bypass mode and/or limit mode are available and configured in power conversion circuitry 112. If in operation 606 it is determined that the power conversion circuitry is in bypass mode (e.g., due to the output of the string of photovoltaic cells 110 (e.g., 110A) is low because, for example, cells 110 are at least partially shaded), then in operation 604 the operation of power conversion circuitry 112 may remain unchanged. Alternatively, if it is determined in operation 606 that the power conversion circuitry is not in bypass mode, then in operation 608 a further determination may be made as to whether the power conversion circuitry 112 is operating in limit mode (e.g., power conversion circuitry 112 is already generating voltage and/or power at or near a certain maximum capacity level). If in operation 608 it is determined that the power conversion circuitry 112 is operating in limit mode, then in operation 604 the operation of power conversion circuitry 112 may remain unchanged. Otherwise, in operation 610 the voltage and/or power generation of the power conversion circuitry 112 may be increased, which may be followed by a return to operation 600 to reinitiate control operations for conversion circuitry 112 with another measurement.

"Circuitry" or "circuit", as used in any embodiment herein, may comprise, for example, singly or in any combination, hardwired circuitry, programmable circuitry, state machine circuitry, and/or circuitry available in a larger system, for example, discrete elements that may be included as part of an integrated circuit. In addition, any of the switch devices described herein may include any type of known or after-developed switch circuitry such as, for example, MOS transistors, BJTs, etc.

Any of the operations described herein may be implemented in a system that includes one or more storage mediums having stored thereon, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software modules executed by a programmable control device.

Thus, the present disclosure is directed to photovoltaic system power optimization. An example system may comprise at least one solar panel including a plurality of photovoltaic cells, wherein the photovoltaic cells are grouped into at least a first group of cells and a second group of cells. The first and second groups of cells may be coupled in series to a DC bus to deliver DC voltage and power to the DC bus. The system may further include first power conversion circuitry configured to generate power from the first group of cells and second power conversion circuitry configured to generate power from the second group of cells, and inverter circuitry coupled to the DC bus and configured to generate AC power from the DC bus. The first power conversion circuitry may be configured to automatically adjust at least one of an output voltage or power delivered to the DC bus based on an operating point of the second power conversion circuitry.

In one example embodiment there is provided a system. The system may include at least one solar panel comprising a plurality of photovoltaic cells, wherein the photovoltaic cells are grouped into at least a first group of cells and a second group of cells, the first group of cells and the second group of cells being coupled in series to a DC bus to deliver a DC voltage and power to the DC bus, first power conversion circuitry configured to generate power from the first group of cells and second power conversion circuitry configured to generate power from the second group of cells, inverter circuitry coupled to the DC bus and configured to generate AC power from the DC bus, wherein the first power conversion circuitry is configured to automatically adjust at least one of an output voltage or power delivered to the DC bus based on an operating point of the second power conversion circuitry.

In another example embodiment there is provided a method. The method may include measuring at least one of voltage or power on a DC bus, determining whether at least one of the voltage or power on the DC bus is below a certain level, and controlling voltage generation in power conversion circuitry based on the determination, the power conversion circuitry being coupled to photovoltaic cells configured to provide power for the voltage generation.

In another example embodiment there is provided at least one machine-readable storage medium having stored thereon, individually or in combination, instructions that when executed by one or more processors result in the following operations comprising measuring at least one of voltage or power on a DC bus, determining whether at least one of the voltage or power on the DC bus is below a certain level, and controlling voltage generation in power conversion circuitry based on the determination, the power conversion circuitry being coupled to photovoltaic cells configured to provide power for the voltage generation.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A method, comprising:
measuring at least one of voltage or power on a DC bus;
determining whether at least one of the voltage or power on the DC bus is below a certain level;
controlling voltage generation in power conversion circuitry based on the determination, the power conversion circuitry being coupled to photovoltaic cells configured to provide power for the voltage generation;
determining whether the power conversion circuitry should enter a bypass mode based on the power provided by the photovoltaic cells indicating that the photovoltaic cells are at least partially shaded; and
deactivating the power conversion circuitry if it is determined that the power conversion circuitry should enter the bypass mode.

2. The method of claim 1, wherein controlling voltage generation comprises increasing the voltage generation if it is determined that at least one of the voltage or power is below the certain level.

3. The method of claim 2, wherein the certain level is set by inverter circuitry coupled to the DC bus.

4. The method according to claim 1, further comprising:
limiting voltage generation in the power conversion circuitry when the power conversion circuitry is operating in a limit mode.

5. At least one machine-readable storage medium having stored thereon, individually or in combination, instructions that when executed by one or more processors result in the following operations comprising:
- measuring at least one of voltage or power on a DC bus;
- determining whether at least one of the voltage or power on the DC bus is below a certain level;
- controlling voltage generation in power conversion circuitry based on the determination, the power conversion circuitry being coupled to photovoltaic cells configured to provide power for the voltage generation;
- determining whether the power conversion circuitry should enter a bypass mode based on the power provided by the photovoltaic cells indicating that the photovoltaic cells are at least partially shaded; and
- deactivating the power conversion circuitry if it is determined that the power conversion circuitry should enter the bypass mode.

6. The medium of claim 5, wherein controlling voltage generation comprises increasing the voltage generation if it is determined that at least one of the voltage or power is below the certain level.

7. The medium of claim 6, wherein the certain level is set by inverter circuitry coupled to the DC bus.

8. The medium according to claim 5, further comprising instructions that when executed by one or more processors result in the following operations comprising:
- limiting voltage generation in the power conversion circuitry when the power conversion circuitry is operating in a limit mode.

* * * * *